(12) United States Patent
Bhagath et al.

(10) Patent No.: US 8,575,724 B2
(45) Date of Patent: Nov. 5, 2013

(54) SEMICONDUCTOR DEVICE HAVING UNDER-FILLED DIE IN A DIE STACK

(75) Inventors: Shrikar Bhagath, San Jose, CA (US); Hem Takiar, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 179 days.

(21) Appl. No.: 12/906,523

(22) Filed: Oct. 18, 2010

(65) Prior Publication Data

US 2011/0024881 A1 Feb. 3, 2011

Related U.S. Application Data

(63) Continuation of application No. 12/494,803, filed on Jun. 30, 2009, now Pat. No. 7,816,181.

(51) Int. Cl.
*H01L 23/492* (2006.01)

(52) U.S. Cl.
USPC 257/621; 257/686; 257/E25.03; 257/E23.132; 257/E23.174

(58) Field of Classification Search
USPC .............. 257/621, 686, E25.03, E23.132, 257/E21.503, E21.614, E23.174
See application file for complete search history.

(56) References Cited

U.S. PATENT DOCUMENTS

| | | | |
|---|---|---|---|
| 7,579,684 B2 | 8/2009 | Benson et al. | |
| 7,843,072 B1* | 11/2010 | Park et al. | 257/774 |
| 2007/0048902 A1 | 3/2007 | Hlatt et al. | |
| 2007/0202617 A1 | 8/2007 | Hembree | |
| 2008/0122053 A1 | 5/2008 | Ofner et al. | |
| 2008/0203539 A1 | 8/2008 | Wood et al. | |
| 2008/0303031 A1* | 12/2008 | Toh et al. | 257/74 |
| 2008/0303131 A1* | 12/2008 | McElrea et al. | 257/686 |
| 2008/0315434 A1* | 12/2008 | McElrea et al. | 257/777 |
| 2009/0065916 A1* | 3/2009 | Crane et al. | 257/676 |
| 2009/0294916 A1* | 12/2009 | Ma et al. | 257/621 |
| 2009/0321948 A1* | 12/2009 | Wang et al. | 257/777 |
| 2010/0052157 A1* | 3/2010 | Pratt | 257/712 |
| 2010/0096738 A1* | 4/2010 | Simmons-Matthews et al. | 257/686 |
| 2010/0117224 A1* | 5/2010 | McElrea et al. | 257/723 |
| 2010/0171203 A1* | 7/2010 | Chen et al. | 257/686 |
| 2010/0206737 A1* | 8/2010 | Preisser | 205/123 |
| 2010/0326702 A1* | 12/2010 | Dang et al. | 174/250 |
| 2011/0037159 A1* | 2/2011 | McElrea et al. | 257/686 |
| 2011/0147943 A1* | 6/2011 | McElrea et al. | 257/773 |

OTHER PUBLICATIONS

Notice of Allowance and Fee(s) Due in U.S. Appl. No. 12/494,803, Jun. 15, 2010.

* cited by examiner

*Primary Examiner* — George Fourson, III
(74) *Attorney, Agent, or Firm* — Vierra Magen Marcus LLP

(57) ABSTRACT

A semiconductor device including a semiconductor die in a die stack under-filled with a film. Once the semiconductor die are formed, they may be stacked and interconnected. The interconnection may leave a small space between semiconductor die in the die stack. This space is advantageously completely filled using a vapor deposition process where a coating is deposited as a vapor which flows over all surfaces of the die stack, including into the spaces between the die in the stack. The vapor then deposits on the surfaces between and around the die and forms a film which completely fills the spaces between the die in the die stack. The material used in the vapor deposition under-fill process may for example be a member of the parylene family of polymers, and in embodiments, may be parylene-N.

7 Claims, 8 Drawing Sheets

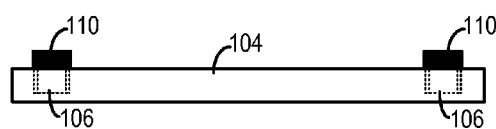
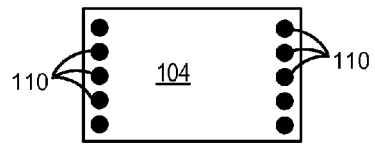
Fig. 8
Fig. 9
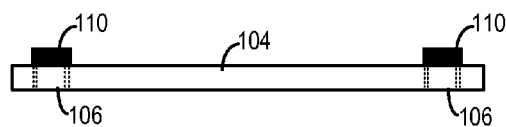
Fig. 10
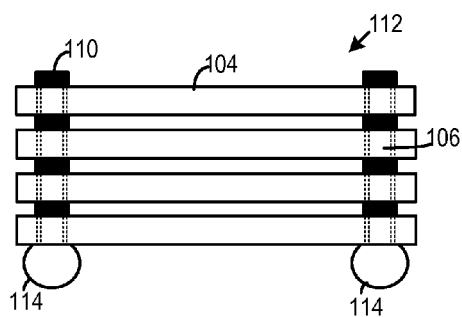
Fig. 11
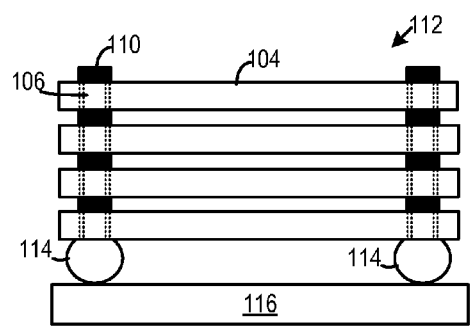
Fig. 12

*Fig. 13*
(Step 230)
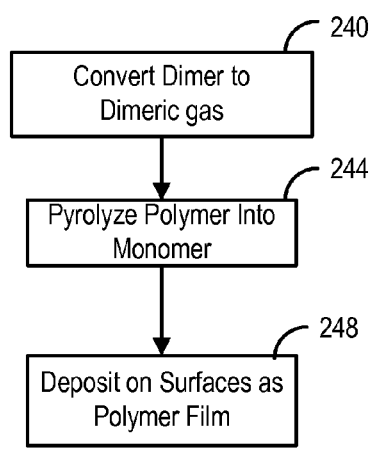
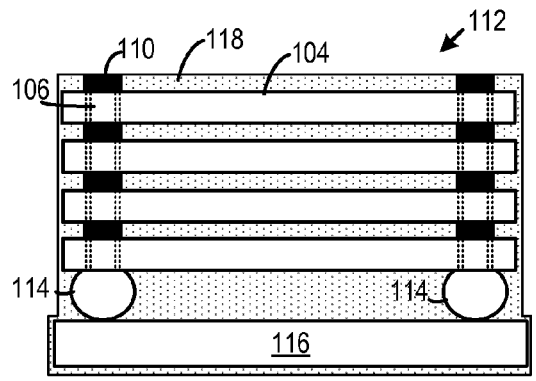
*Fig. 14*
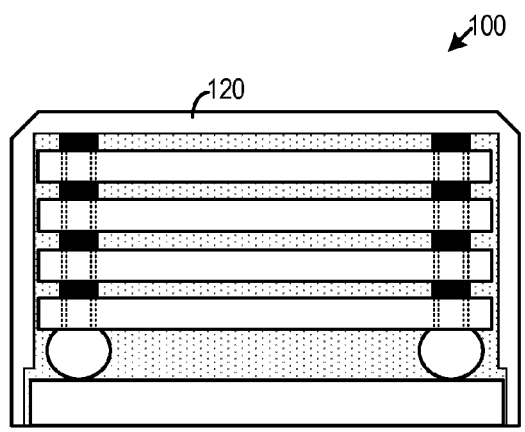
*Fig. 15*

SEMICONDUCTOR DEVICE HAVING UNDER-FILLED DIE IN A DIE STACK

CLAIM OF PRIORITY

This application is a continuation of U.S. patent application Ser. No. 12/494,803 filed Jun. 30, 2009, entitled "Method Of Under-Filling Semiconductor Die In A Die Stack And Semiconductor Device Formed Thereby", which application is incorporated herein by reference in its entirety.

BACKGROUND

1. Field

Embodiments relate to a method of under-filling semiconductor die in a die stack and a semiconductor device formed thereby.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a so-called three-dimensional stacked configuration. The substrate may in general include a rigid, dielectric base having a conductive layer etched on one or both sides. Electrical connections are formed between the die and the conductive layer(s), and the conductive layer(s) in the substrate provide an electric lead structure for connection of the die to a host device. Once electrical connections between the die and substrate are made, the assembly is then typically encased in a molding compound to provide a protective package.

Many semiconductor packages use wire bonding to electrically connect the semiconductor die with the substrate. In wire bonded packages, wires are connected between bond pads on the surface of each semiconductor die at one end, and portions of the substrate at the other end. In order to provide a bonding position for the bond wires to attach to the bond pads on each semiconductor die, the bond wires require vertical spacing between the semiconductor die, or horizontal offset stacking of the semiconductor die. Similarly, in order to provide space for the wire bonds on the substrate, portions of the substrate extend out beyond the edges of the die mounted thereon, thereby requiring a larger substrate.

In view of the trend toward smaller package sizes and increased storage densities, alternative technologies are being developed for electrically connecting the semiconductor die in a package without wire bonds and/or without a substrate. One such alternative technology uses through silicon vias (TSV). TSV technology involves forming holes, or vias, in the semiconductor die, typically at the wafer level. These holes are plated and filled with an electrical conductor, such as copper. Signals to and from the die in the stack are carried through the vias, so that the space otherwise needed for wire bonding may be omitted. Omission of the bond wires also improves signal to noise ratio and yield rates, as bond wires are fragile and can break or short together during the package fabrication process. It is also possible to omit the substrate in packages formed by TSV technology, as the finished package can be soldered directly to a host device such as a printed circuit board.

An example of a conventional TSV semiconductor chip stack 20 is shown in the cross-sectional view of FIG. 1. The chip stack 20 includes a plurality of semiconductor die 22-28. Although four die are shown, it is known to provide more or less semiconductor die in alternative configurations. The integrated circuitry in each of the semiconductor die 22-28 is electrically connected to through silicon vias 30 and interconnect pads 32 formed in each die. The number and location of vias 30 and pads 32 may vary in different configurations. In some semiconductor devices, such as flash memory, the vias 30 and interconnect pads 32 in each die in the die stack may align with each other as shown in FIG. 1. Thus, electrical signals may be communicated to and from each of the die through the vias 30 and interconnect pads 32. Solder bumps 36 may be provided for affixing the semiconductor chip stack 20 to a substrate, such as a printed circuit board. The chip stack and substrate may then be encapsulated to form a finished semiconductor package.

The interconnect pads 32 are provided to allow the vias 30 in the respective die 22-26 to be electrically coupled to each other. It is known to form the interconnect pads 32 at the wafer level using copper-to-copper diffusion, solder bumping or some other metal bonding technique. Regardless, the height of interconnect pads results in a small space (e.g. 5-10 μm) between each of the die 22-28 in the die stack.

There are disadvantages to leaving the empty spaces between the die 22-28. First, the coefficient of thermal expansion of the silicon die and the metal interconnect pads are different. Thus, when the chip stack is heated during subsequent fabrication processes, these mismatched coefficients of thermal expansion can result in the separation of the interconnect pads 32 from the die 22-28 and die failure. Moreover, left unsealed, moisture ingress into the empty space can lead to corrosion of the interconnect pads 32.

It is therefore known to add a sealant 40 into the empty spaces between the die 22-28. The addition of sealant 40 encapsulates the interconnect pads 32 and serves to redistribute the stresses resulting from thermal mismatch at the interconnect pads 32 over a wider area. Moreover, the sealant 40 prevents moisture from corroding the interconnect pads.

However, conventional methods for under-filling the spaces between the respective die involve introducing a liquid sealant, and allowing that sealant to fill the entire empty space by capillary action. However, with the drive to reduce the size of semiconductor packages, the interconnect pads 32 are being made with lower and lower profiles. At current interconnect pad profiles, it may happen that surface tension and the viscosity of the liquid sealant prevent the sealant 40 from fully under-filling the space between the die, resulting in voids 42. Voids 42 tend to propagate, for example during heating and expansion of the gasses in voids 42. This propagation of any voids can result in exposure of the interconnect pads, and even delamination of one or more die from the chip stack.

DESCRIPTION OF THE DRAWINGS

FIG. 8 is an end view of a semiconductor die during a still later stage of fabrication.

FIG. 9 is a top view of a semiconductor die during a still later stage of fabrication.

FIG. 10 is an end view of a semiconductor die during a final stage of fabrication.

FIG. 11 is an end view of semiconductor die stacked and interconnected to each other.

FIG. 12 is an end view of semiconductor die stack mounted to a substrate.

FIG. 13 is a flowchart showing additional detail steps of the vapor deposition process for under-filling the spaces between semiconductor die in the die stack.

FIG. 14 is an end view of a die stack and substrate including a coating after the vapor deposition process.

FIG. 15 is an end view of a finished semiconductor package formed according to an embodiment.

DETAILED DESCRIPTION

Embodiments will now be described with reference to FIGS. 2 through 20, which relate to a semiconductor device and methods of forming same. It is understood that the present semiconductor device may be embodied in many different forms and should not be construed as being limited to the embodiments set forth herein. The terms "top" and "bottom" and "upper" and "lower," and derivations of these terms are used herein for convenience and illustrative purposes only, and are not meant to limit the description of the semiconductor device inasmuch as the referenced item can be exchanged in position.

In general, embodiments relate to a method of under-filling semiconductor die in a die stack and a semiconductor device formed thereby. The semiconductor device may be fabricated using through silicon via technology. In such an embodiment, vias are formed on semiconductor die on a wafer, and plated with interconnect pads. The interconnect pads extend above a surface of the semiconductor die. Once the vias and interconnect pads are defined, backgrinding of the wafer is performed to reduce the wafer to a final thickness. The die on the wafer may then be separated, stacked and interconnected. Interconnection may be accomplished by aligning the interconnect pads on one die with the vias on the die stacked thereon, and then bonding the interconnect pads to the aligned vias using metal diffusion or other bonding techniques.

Owing to the height of the interconnect pads above the surface of the die, a slight space exists between die in the die stack. This space is advantageously completely filled using a vapor deposition process where a coating is deposited as a vapor which flows over all surfaces of the die stack, including into the spaces between the die in the stack. The vapor then deposits on the surfaces between and around the die and forms a film which completely fills the spaces between the die in the die stack. In embodiments, the material used in the vapor deposition under-fill process is a member of the parylene family of polymers, and in embodiments, may be parylene-N.

In an alternative embodiment explained below, instead of separating the die from the wafer and then stacking them, the wafers themselves may be stacked and the interconnect pads on the die of a first wafer connected to the vias on the die of a wafer stacked thereon. The space between the wafers may be completely filled with a vapor deposition under-fill process, using for example parylene as the vapor deposition material. Once the wafers are interconnected and the spaces between the wafers are filled, respective semiconductor devices may be separated from the stacked wafers.

Figure 1:
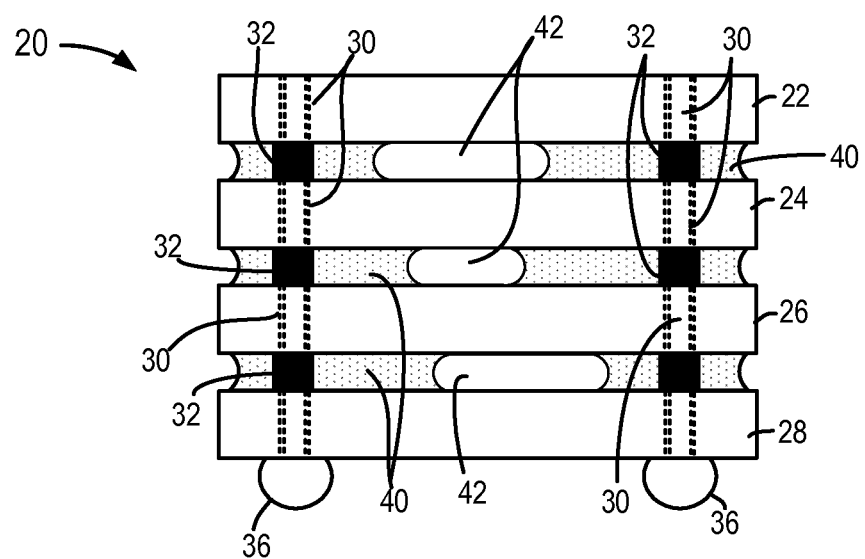
FIG. 1 is a prior art end view of a conventional semiconductor device formed using through silicon via technology.
Figure 2:
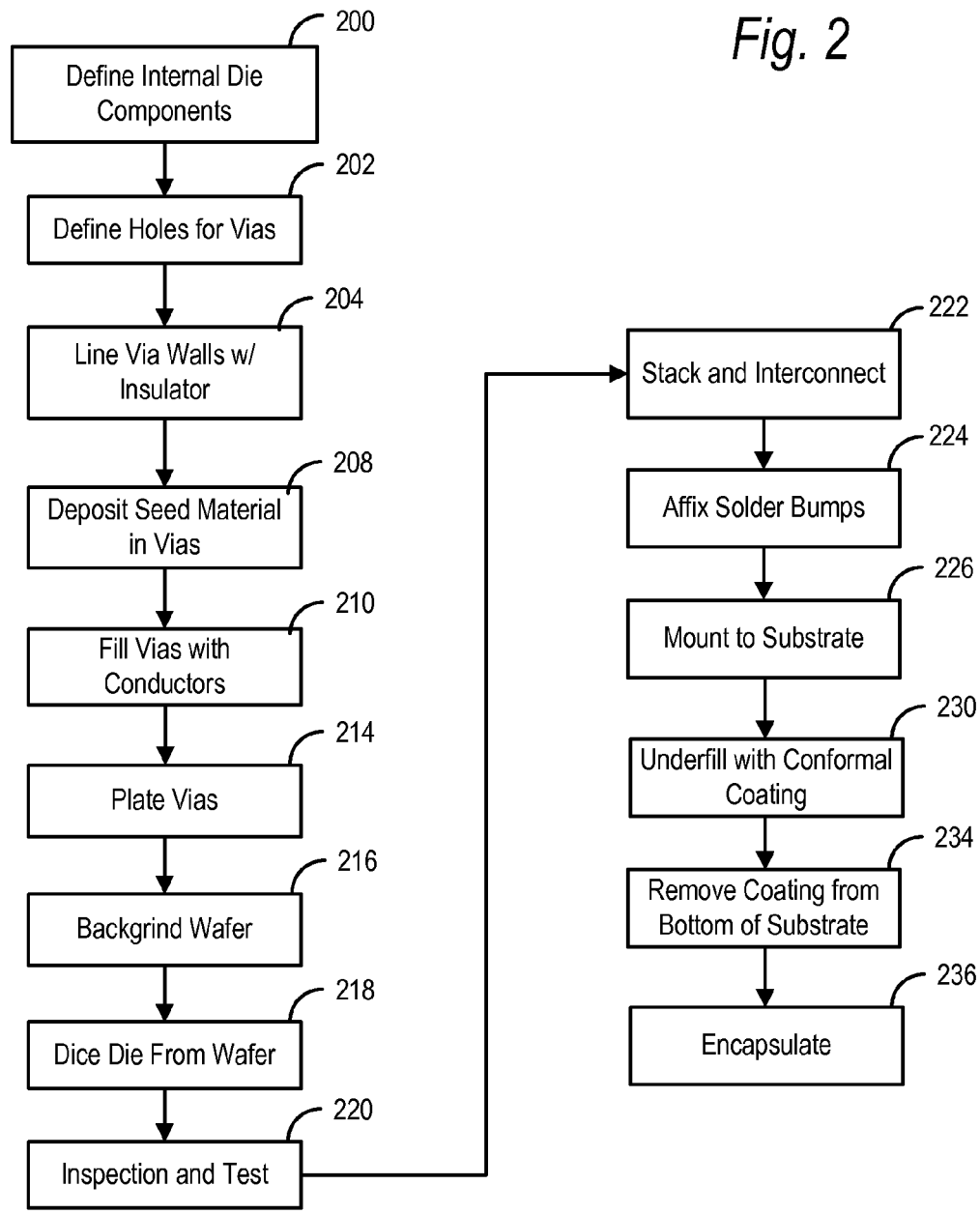
FIG. 2 is a flowchart showing the fabrication of a semiconductor device according to an embodiment.
Figure 3:
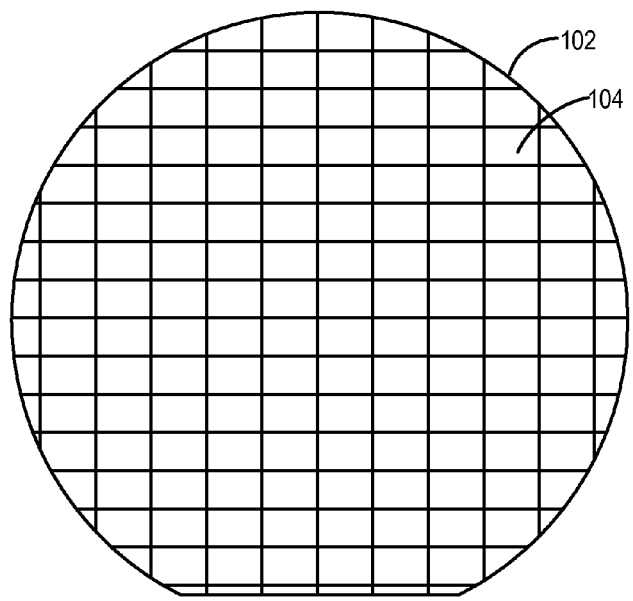
FIG. 3 is a top view of a wafer from which an embodiment of a semiconductor device may be fabricated.

A process for forming a semiconductor package 100 in accordance with a first embodiment will now be explained with reference to the flowchart of FIG. 2, and the various top and side views of FIGS. 3-11 and 13. FIG. 3 shows the top view of a wafer 102 including a plurality of semiconductor die 104. The internal components of semiconductor die 104 (processors, memory devices, etc.) may be formed as is known in the art by various steps of doping, deposition, etching, metallization, etc. to form the semiconductor die 104 on wafer 102 in step 200.

Figure 4:
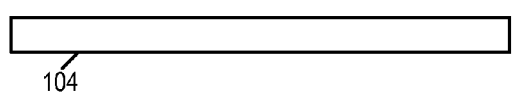
FIG. 4 is an end view of a semiconductor die during a first stage of fabrication.
Figure 5:
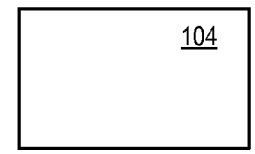
FIG. 5 is a top view of a semiconductor die during a first stage of fabrication.
Figure 6:
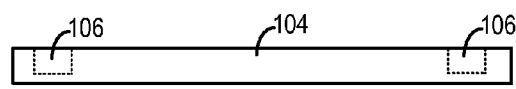
FIG. 6 is an end view of a semiconductor die during a later stage of fabrication.
Figure 7:
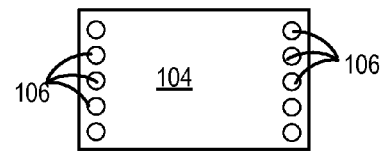
FIG. 7 is a top view of a semiconductor die during a later stage of fabrication.
Figure 16:
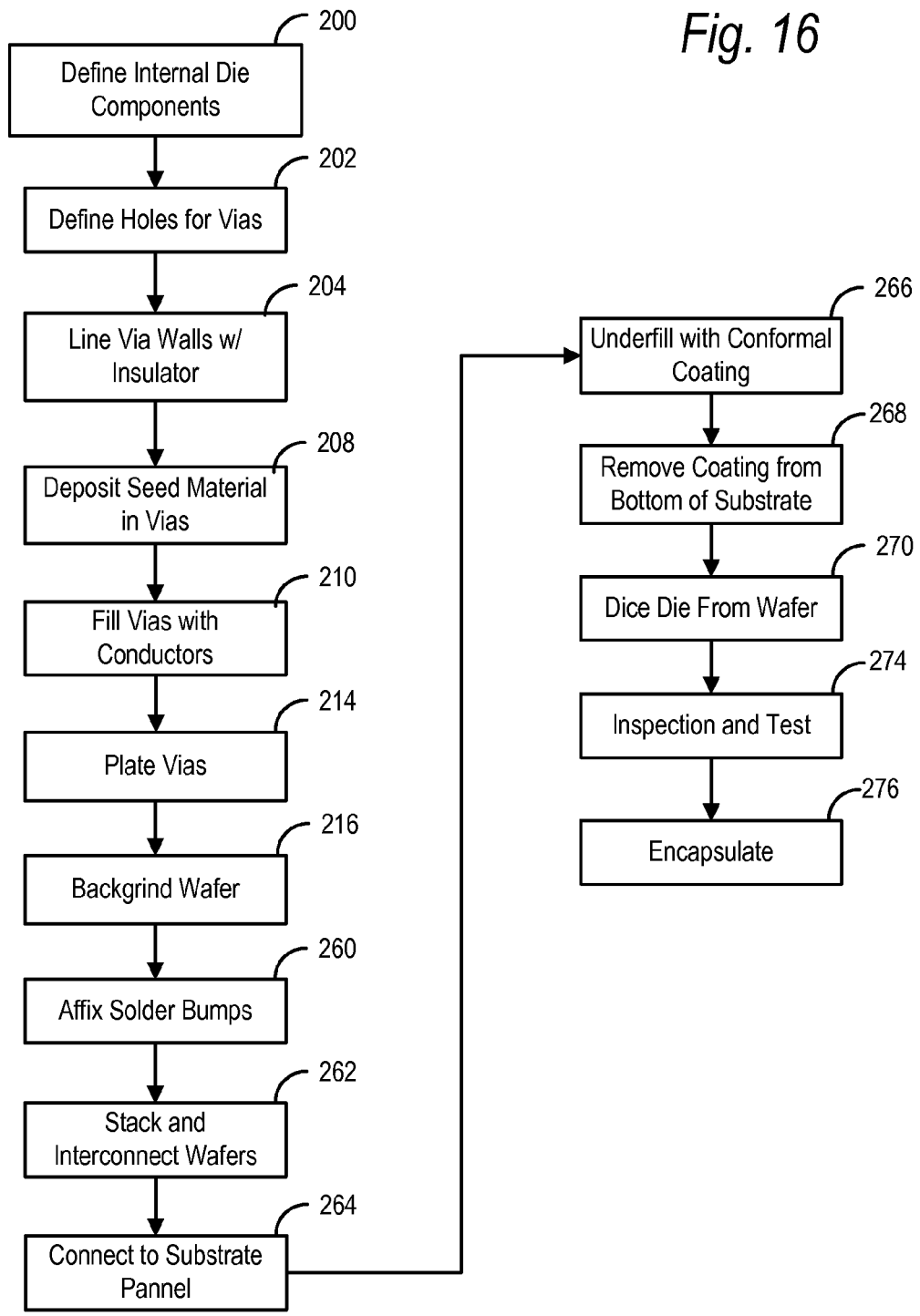
FIG. 16 is a flowchart showing the fabrication of a semiconductor device according to a further embodiment.

FIGS. 4 and 5 are side and top views, respectively, of a single semiconductor die 104 after formation of the internal components. While the following description is with respect to a single die 104, it is understood that the following steps are performed on each die 104 on wafer 102. In step 202, vias 106 are formed partially through the die 104 as shown in FIGS. 6 and 7. The vias 106 may be formed by known techniques, such as drilling for example by laser ablation, or etching for example by deep reactive ion etching (DRIE). In embodiments, the vias 106 may have diameters ranging from 10 to 40 μm and may be etched to a depth of 70-120 μm. However, it is understood that the diameter and depth of the vias formed in step 202 may vary in alternative embodiments. Additionally, while the vias are shown toward opposite ends of the semiconductor die 104, it is understood that the vias may be anywhere on the die 104, and the number of vias may be more or less than shown. As explained hereinafter, the die 104 are eventually diced from the wafer and stacked. The vias 106 in the various layers of die in the die stack may align with each other. Alternatively, vias 106 in different layers of the die stack may not align with each other.

After the vias are formed, the via walls are lined with an insulating material in step 204 using for example a TEOS deposition or similar insulating material. In step 208, a seed conductive material is deposited on the insulated walls, and the vias are then filled using a conductor such as copper in step 210. The vias may be filled with other conductors in alternative embodiments, such as for example tungsten or a doped polysilicon lithographically formed within vias 106.

In step 214, the vias may be plated with a conductor such as copper to form the interconnect pads 110 as shown in FIGS. 8 and 9. The height of the interconnect pads 10 may be between 5 and 10 μm. The space may be smaller than 5 μm, for example 2 μm, and larger than 10 μm, in further embodiments. This height will define the height of the space between adjacent die 104 once the die are assembled into the die stack. The integrated circuitry in each of the semiconductor die 104 is provided so as to electrically connect to one or more of the through silicon vias 106 and interconnect pads 110 formed in each die.

The back, inactive side of the wafer may then be ground to thin the wafer to its final thickness in step 216 as shown in FIG. 10. This backgrind process opens the filled vias 106 to the back side of the wafer.

The above process for forming vias 106 is referred to as a "via first after BEOL" (back end of the line) process meaning the vias 106 are formed after the internal components within the semiconductor die, but prior to backgrind of the wafer. In alternative embodiments, the vias may be formed as a "via first prior to FEOL" (front end of the line) process, meaning the vias are formed in the blank wafer prior to definition of the internal components. In a further embodiment, the vias may be formed as a "via last after BEOL" process, meaning the vias are not formed until after formation of the internal components and backgrinding of the wafer to its final thickness.

In one embodiment, after the vias 106 are formed and plated with interconnect pads 110, the semiconductor die 104 may be diced from the wafer 102 in step 218. In step 220, the individual die 104 may be inspected and tested for proper operation. Those die 104 that pass inspection may then be stacked and interconnected in step 222. As explained hereinafter, instead of being separated and then stacked, the die 104 may remain part of the wafer 102 at this stage, and multiple wafers may be stacked and connected.

However, in the embodiment of FIGS. 2-13, the die 104 are separated from the wafer in step 218, and thereafter stacked and connected into a die stack 112 in step 222. This die stack 112 is shown in FIG. 11. While the stack 112 is shown having four semiconductor die 104, it is understood that there may be more or less die in further embodiments. One embodiment may include eight semiconductor die 104 in the die stack 112. Either before or after dicing, solder bumps 114 may be affixed to the vias 106 on the bottommost die 104 (step 224). Other connectors may be used in place of solder bumps 114 in further embodiments.

The die 104 may be connected to each other in the stack by various interconnect processes, such as for example copper-to-copper diffusion, where the interconnect pads 110 of one semiconductor die are mated to the aligned via of the semiconductor die stacked thereon under high temperature and pressure for a given period of time. The temperature, pressure and duration to accomplish copper-to-copper diffusion bonds are known in the art. Alternative interconnection methods for connecting die 104 in the die stack 112 include diffusion or other types of bonding using other metals, or solder or micro bumps which are used to bond the interconnect pad 110 of one semiconductor die to the aligned via of the semiconductor die stacked thereon.

The solder bumps 114 may be used to affix the die stack 112 to a substrate 116 in step 226 and as shown in FIG. 12. Substrate 116 may be a printed circuit board or other type of substrate, and may include contact fingers (not shown) on a bottom surface for forming the die stack 112 and substrate 116 into a land grid array (LGA) package. Alternatively, substrate 116 may include solder balls (not shown) on a bottom surface for forming die stack 112 and substrate 116 into a ball grid array (BGA) package.

As discussed in the Background section, it is desirable to prevent empty spaces between the die 104 in the die stack. At small spaces, such as those between die 104, conventional liquid diffusion by capillary action can leave voids between the die in the die stack. Therefore, in accordance with the present system, the spaces between the die 104 in the die stack 112 may be completely under-filled using a vapor deposition process in step 230. Further details regarding step 230 are set forth in the flowchart of FIG. 13.

In embodiments, the material used in the vapor deposition under-fill process is a member of the parylene family of polymers, and in embodiments, may be parylene-N. As is known, parylene-N is a linear, highly crystalline molecule manufactured from di-para-xylylene. Di-para-xylylene, also known as paracyclophane, is made from para-xylylene in steps involving bromination, amination and elimination. Parylene-N has advantages in that, during deposition, it forms a conformal coating from a monomeric vapor without an intermediate liquid stage. Thus, the vapor flows over all surfaces to completely fill the spaces between the die 104 in the die stack 112, and then deposits on the surfaces as a film to completely seal the spaces. Moreover, the parylene coating is an electrical insulator, generally impervious to external moisture and gasses and exhibits virtually no outgassing.

In order to under-fill the spaces between the die, the die stack 112 is placed in a vacuum deposition chamber together with the parylene-N. The parylene initially exists as a dimer, which is a chemical consisting of two structurally similar subunits (monomers), which may be held together by molecular forces. With reference to the flowchart of FIG. 12, in step 240, the parylene-N dimer is heated under vacuum to vaporize the parylene-N to a dimeric gas. In one embodiment, the dimer may be heated to 150° C. and maintained at a pressure of 1.0 torr, though this temperature and pressure may vary in further embodiments. In gaseous form, the parylene-N flows into and around all surfaces of the die stack 112, including within the spaces between the die 104.

In step 244, the dimeric gas is pyrolyzed, or chemically cleaved, from its dimer form (di-para-xylylene) into its monomer form (para-xylylene). The pyrolyzation step may take place at 680° C. and 0.5 torr, though this temperature and pressure may vary in further embodiments. In step 248, once in monomer form, the molecules of para-xylylene bond together on the surfaces of the die stack 112, including on the surfaces between adjacent die 104, to form a polymer film on all surfaces of uniform thickness. Step 248 may take place at room temperature and 0.1 torr, but again, this temperature and pressure may vary in alternative embodiments. The polymer film deposition in step 248 takes place at a controlled and uniform rate, such as for example 0.0002 inches/hour, so that the thickness of the film may be uniformly controlled by the time of the process. The process may be carried out at least as long as is required to completely fill the spaces between the die 104 in the die stack 112, and to encapsulate all exposed surfaces of the die 104 and interconnect pads 110. An example of a vacuum deposition chamber capable of performing the above steps 240-248 is manufactured by Specialty Coatings, Inc., Indianapolis, Ind.

FIG. 14 shows a finished chip stack 112 and substrate 116 with the spaces between die 104 under-filled with coating 118. The space between the lowermost die and substrate may also be filled with the coating 118. The coating 118 isolates and protects all exposed surfaces of die 104 and pads 110. Moreover, as the coating 118 entirely fills the spaces between the die 104, the danger posed by expanding voids found in the prior art is alleviated. As explained above, parylene-N has advantageous properties for use in completely under-filling the spaces between adjacent die 104. However, those of skill in the art will appreciate that other polymers which may be deposited in vapor form can be used in place of parylene-N in alternative embodiments of the present semiconductor device.

The coating on the underside of the substrate may be removed in step 234 so that the contact fingers or solder balls (not shown) may be exposed on the bottom of the substrate. The coating may be removed using laser ablation or other known removal method. Alternatively, the electrical connectors on the underside of the substrate may be covered during the vapor deposition process, and the cover(s) removed after the process to provide the exposed electrical connectors. The chip stack 112 and substrate 116 may then be encapsulated in a resin molding compound in step 236 to form a finished semiconductor package 100 as shown in FIG. 15. The finished package 100 may then be tested and inspected.

In the embodiments described above, the die 104 are separated from the wafer 102 prior to the stacking and under-filling steps. In a further embodiment, described with respect to the flowchart of FIG. 16 and the top and side views of FIGS. 17-20, the die may be stacked atop each other while still being part of the wafer 102 as a whole. The embodiment of FIG. 16 may include the same initial steps 200-216 described above with respect to FIG. 2 of forming the vias and interconnect pads and backgrinding the wafer. Solder bumps 114 may be affixed in step 260 (or later in the process as described above). After these steps are completed, wafers fabricated in this manner may be stacked and interconnected to each other in step 262, and mounted on a substrate panel 216 in step 264. A wafer stack 160 per these steps is shown in FIGS. 17 and 18.

Figure 17:
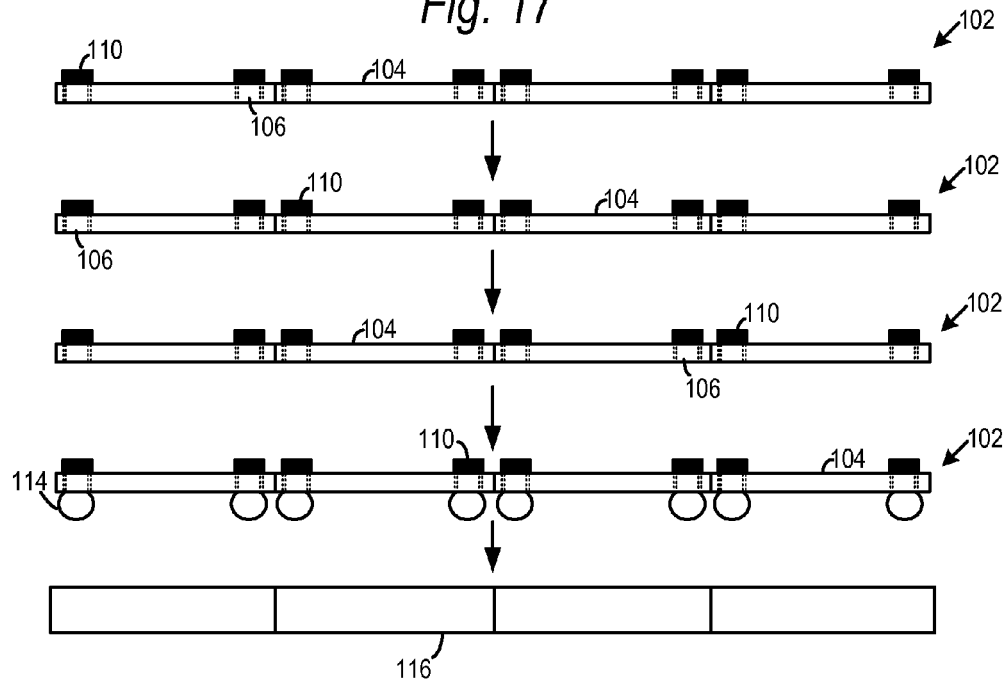
FIG. 17 is an end view of a plurality of semiconductor wafers and a substrate panel aligned for stacking with each other.
Figure 18:
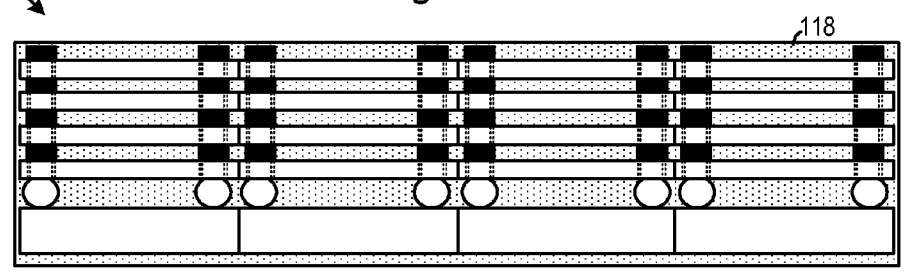
FIG. 18 is an end view of a plurality of interconnected semiconductor wafers and substrate panel including a coating after the vapor deposition process.

FIGS. 17 and 18 show four wafers 102, though it is understood that more or less wafers 102 may be stacked and interconnected in further embodiments. Each wafer 102 includes a plurality of die 104 as described above (the number of die 104 shown is by way of example, and a given row on a wafer 102 may include a greater or lesser number of die 104). As seen in FIG. 18, the wafers 102 may be interconnected by aligning the wafers to each other so as to align the interconnect pads 110 of the die on one wafer with the vias 106 of the die on the wafer stacked thereon. The interconnect pads 110 may be affixed to the vias by copper-to-copper diffusion or other methods described above.

As seen in FIG. 18 and described above, the interconnect pads 110 create a small space between adjacent wafers 102, which space is desirably under-filled. In step 266, any and all space between adjacent wafers 102 may be under-filled, for example by applying a coating such as parylene-N as a vapor as described above with respect to step 230 of FIG. 2 and the more detailed steps 240-248 of FIG. 13. Wafers 102 may for example be 12 inches in diameter, and the spacing between wafers 102 may be between 5 and 10 µm, though it may be smaller or larger than that in further embodiments. Conventional under-fill methods are not able to under-fill spaces of this diameter and height. However, applying a coating such as parylene-N as a vapor, that flows into all spaces and adheres to all surfaces as a film as described above, allows the spacing between adjacent wafers 102 to be filled without any voids. The space between the lowermost wafer 102 and substrate panel 116 may also be under-filled during this process.

Figure 19:
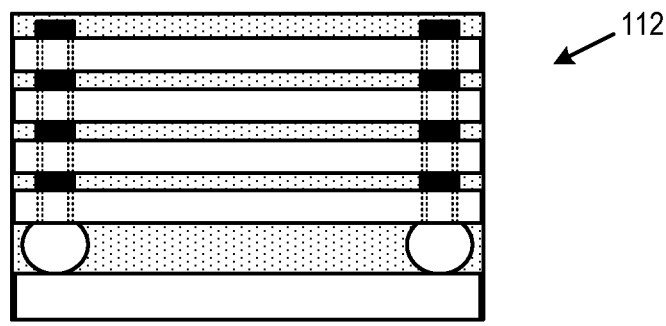
FIG. 19 is an end view of a die stack and substrate including a coating after the vapor deposition process.

After the coating 118 is formed around and in between the wafers 102 of the wafer stack 160 as shown in FIG. 18, the coating on the lower surface of the substrate panel 116 may be removed in a step 268, though this step may be performed after dicing. In step 270, the wafer stack 160 may be diced to form individual die stacks 112 as shown in FIG. 19. Thereafter, the die stacks 112 may be inspected and tested in step 274, and encapsulated in step 276 to form a finished semiconductor package 100 as shown in FIG. 20.

In embodiments described above, separated semiconductor die may be stacked, interconnected and insulated by a vapor deposition process, and semiconductor wafers as a whole may be stacked, interconnected and insulated by a vapor deposition process. It is understood that these processes may be combined in further embodiments. For example, one or more separated semiconductor die may be stacked on or together with one or more whole semiconductor wafers. Once the stack of wafers and die is interconnected, any spaces between layers of the stack may be under-filled with a vapor deposition process as described above. A dicing step may then be performed to yield the finished semiconductor die stacks.

In the embodiments described above, a vapor deposition process was used to fill the space between semiconductor die formed using TSV technology. However, it is understood that the present system is not limited to use in die formed by TSV technology. It is contemplated that semiconductor die may be stacked together using other fabrication methodologies which result in a space between two or more of the adjacent die in the die stack. The above-described method of using a vapor deposition process with parylene-N or other material may be used to fill those spaces.

Figure 20:
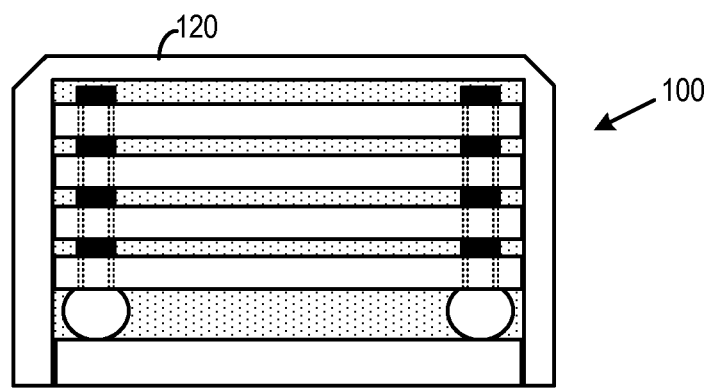
FIG. 20 is an end view of a finished semiconductor package formed according to an alternative embodiment.

The package 100 shown in FIGS. 15 and 20 may be any of various semiconductor devices, including for example flash memory, DRAM, SRAM and CMOS devices. The die 104 in the respective layers of package 100 may all be the same type of die, such as for example a flash memory die. Alternatively, one or more of the die 104 in the respective layers of package 100 may be different, such as for example including flash memory die and a controller such as an ASIC. It is understood that the package 100 may include semiconductor die configured to perform other functions in further embodiments. As indicated above, the package 100 may be used as a BGA package, where the solder balls are used to permanently affix the package 100 to a host printed circuit board. Alternatively, the package 100 may be used as an LGA package including contact fingers that may removably mate with contact terminals within a slot of a host device, such as a PC, camera or other electronic device.

As described in the claims that follow, a method is disclosed for fabricating a semiconductor device. The method includes the step of stacking a plurality of semiconductor die atop each other, this step leaving a space between at least two semiconductor die of the plurality of semiconductor die. The method further includes the step of under-filling the space between the at least two semiconductor die by a vapor deposition process.

A further method of fabricating a semiconductor device is disclosed including the step of stacking a plurality of semiconductor die atop each other, which step includes leaving a space between first and second adjacent semiconductor die of the plurality of semiconductor die, so that a first surface of the first semiconductor die faces and is spaced from a second surface of the second semiconductor die. The method further includes the steps of exposing the plurality of semiconductor die to a gas, and allowing molecules of the gas to deposit and bond together on the first and second surfaces defining the space to build up a film on the first and second surfaces that fills and closes the space between the first and second surfaces.

A further method of fabricating a semiconductor device is disclosed including the step of mounting one or more semiconductor die on a substrate, wherein this mounting step leaves a space between the substrate and the semiconductor die mounted directly thereto, so that a first surface of the substrate faces and is spaced from a second surface of the directly mounted semiconductor die. The method further includes the steps of exposing the substrate and one or more semiconductor die to a gas, and allowing molecules of the gas to deposit and bond together on the first and second surfaces to build up a film on the first and second surfaces that fills and closes the space between the first and second surfaces.

The foregoing detailed description has been presented for purposes of illustration and description. It is not intended to be exhaustive or to limit the description to the precise form disclosed. Many modifications and variations are possible in light of the above teaching. The described embodiments were chosen in order to best explain the principles of the claimed method and its practical application to thereby enable others skilled in the art to best utilize the claimed method in various embodiments and with various modifications as are suited to the particular use contemplated. It is intended that the scope of the method be defined by the claims appended hereto.

We claim:

1. A semiconductor device, comprising:
   a plurality of semiconductor wafers, each wafer including a plurality of semiconductor die, each semiconductor die including a plurality of interconnect pads and a plurality of through silicon vias, the plurality of semiconductor wafers aligned, stacked and affixed to each other, with the interconnect pads of a first semiconductor wafer aligned with a via of the next adjacent semiconductor wafer, and
   a vapor-deposited material filling a space between adjacent semiconductor wafers in the plurality of semiconductor wafers,
   wherein the plurality of interconnect pads on the plurality of semiconductor die extend above the surface of the semiconductor die to define a height of the space between the at least two semiconductor wafers.

2. The device of claim 1, wherein the material under-filling the spaces between at least two semiconductor wafers is, at one point during fabrication of the device, a monomeric gas having molecules which bond together on the surfaces of the stacked semiconductor die to form of polymer film on the surfaces of the stacked semiconductor die.

3. The device of claim 1, wherein the material under-filling the spaces between at least two semiconductor wafers is from the parylene family of polymers.

4. The device of claim 3, wherein the material under-filling the spaces between at least two semiconductor wafers is parylene-N.

5. The device of claim 1, wherein the interconnect pads are between 5 μm and 10 μm above a surface of the semiconductor die.

6. The device of claim 1, wherein the filled space between the at least two semiconductor wafers is between 5 μm and 10 μm.

7. The device of claim 1, wherein the filled space between the at least two semiconductor wafers is between 2 μm and 5 μm.

* * * * *